US008683280B2

(12) United States Patent
Rajski et al.

(10) Patent No.: US 8,683,280 B2
(45) Date of Patent: Mar. 25, 2014

(54) TEST GENERATOR FOR LOW POWER BUILT-IN SELF-TEST

(75) Inventors: Janusz Rajski, West Linn, OR (US);
Jerzy Tyszer, Poznan (PL); Grzegorz Mrugalski, Swarzedz (PL); Benoit Nadeau-Dostie, Gatineau (CA)

(73) Assignee: Mentor Graphics Corporation, Wilsonville, OR (US)

( * ) Notice: Subject to any disclaimer, the term of this patent is extended or adjusted under 35 U.S.C. 154(b) by 141 days.

(21) Appl. No.: 13/451,527

(22) Filed: Apr. 19, 2012

(65) Prior Publication Data

US 2012/0272110 A1    Oct. 25, 2012

Related U.S. Application Data

(60) Provisional application No. 61/477,105, filed on Apr. 19, 2011, provisional application No. 61/543,229, filed on Oct. 4, 2011.

(51) Int. Cl.
*G01R 31/28* (2006.01)
*G06F 11/00* (2006.01)

(52) U.S. Cl.
USPC ........... 714/729; 714/724; 714/726; 714/727; 714/728; 714/734; 714/736; 714/738; 714/739; 714/30

(58) Field of Classification Search
USPC ......... 714/724, 726, 727, 728, 729, 738, 739, 714/734, 736, 30
See application file for complete search history.

(56) References Cited

U.S. PATENT DOCUMENTS

| | | | | |
|---|---|---|---|---|
| 7,178,078 B2* | 2/2007 | Hiraide et al. | ................ | 714/739 |
| 7,346,819 B2* | 3/2008 | Bansal et al. | ................ | 714/726 |
| 7,353,440 B2* | 4/2008 | Ohwada et al. | ............... | 714/726 |
| 7,647,540 B2* | 1/2010 | Rajski et al. | .................. | 714/738 |
| 7,734,973 B2* | 6/2010 | Hiraide et al. | ................ | 714/729 |
| 7,797,603 B2* | 9/2010 | Rajski et al. | .................. | 714/738 |
| 7,865,792 B2* | 1/2011 | Lin et al. | ........................ | 714/728 |
| 7,925,465 B2* | 4/2011 | Lin et al. | ....................... | 702/124 |
| 8,219,602 B2* | 7/2012 | Golic | ........................... | 708/250 |
| 2012/0005455 A1* | 1/2012 | Ueda | ............................ | 711/217 |

OTHER PUBLICATIONS

A.S. Abu-Issa, S.F. Quigley, "Bit-swapping LFSR for low-power BIST," Electronics Letters, vol. 44, pp. 401-402, 2008.
S. Bhunia, H. Mahmoodi, D. Ghosh, S. Mukhopadhyay, and K. Roy, "Low-power scan design using first-level supply gating," IEEE Trans. VLSI Systems, vol. 13, pp. 384-395, Mar. 2005.
F. Corno, M. Rebaudengo, M. Sonza Reorda, G. Squillero, "Low power BIST via non-linear hybrid cellular automata," Proc. VTS, pp. 29-34, 2000.

(Continued)

*Primary Examiner* — John J Tabone, Jr.

(57) ABSTRACT

Aspects of the invention relate to low power BIST-based testing. A low power test generator may comprise a pseudo-random pattern generator unit, a toggle control unit configured to generate toggle control data based on bit sequence data generated by the pseudo-random pattern generator unit, and a hold register unit configured to generate low power test pattern data by replacing, based on the toggle control data received from the toggle control unit, data from some or all of outputs of the pseudo-random pattern generator unit with constant values during various time periods. The low power test generator may further comprise a phase shifter configured to combine bits of the low power test pattern data for driving scan chains.

20 Claims, 15 Drawing Sheets

(56) References Cited

OTHER PUBLICATIONS

S. Gerstendorfer and H.-J. Wunderlich, "Minimized power consumption for scan-based BIST," Proc. ITC, pp. 77-84, 1999.

P. Girard, L. Guiller, C. Landrault, and S. Pravossoudovitch, "A test vector inhibiting technique for low energy BIST design," Proc. VTS, pp. 407-412, 1999.

P. Girard, L. Guiller, C. Landrault, S. Pravossoudovitch, and H.-J. Wunderlich "A modified clock scheme for a low power BIST test pattern generator," Proc. VTS, pp. 306-311, 2001.

P. Girard, C. Landrault, S. Pravossoudovitch, A. Virazel, and H.-J. Wunderlich, "High defect coverage with low-power test sequences in a BIST environment," IEEE Design & Test of Computers, vol. 19, pp. 44-52, Sep.-Oct. 2002.

P. Girard, N. Nicolici, X. Wen (ed.), Power-Aware Testing and Test Strategies for Low Power Devices, Springer, New York 2010.

Y. Kim, M.-H. Yang, Y. Lee, and S. Kang, "A new low power test pattern generator using a transition monitoring window based on BIST architecture", Proc. ATS, pp. 230-235, 2005.

X. Lin and J. Rajski, "Adaptive low shift power test pattern generator," Proc. ATS, pp. 355-360, 2010.

B. Nadeau-Dostie, K. Takeshita, and J.-F Cote, "Power-aware at-speed scan test methodology for circuits with synchronous clocks," Proc. ITC, 2008, paper 9.3.

M. Nourani, M. Tehranipoor, and N. Ahmed, "Low-transition LFSR for BIST-based applications," Proc. ATS, pp. 138-143, 2005.

P. M. Rosinger, B. M. Al-Hashimi, and N. Nicolici, "Low power mixed-mode BIST based on mask pattern generation using dual LFSR re-seeding," Proc. ICCD, pp. 474-479, 2002.

T. Saraswathi, K. Ragini, and C.G. Reddy, "A review on power optimization of linear feedback shift register (LFSR) for low power built in self test (BIST)," Proc. ICECT, pp. 172-176, 2011.

B. Singh, A. Khosia, and S. Bindra, "Power optimization of linear feedback shift register (LFSR) for low power BIST," Proc. IACC, pp. 311-314, 2009.

S. Wang, "Generation of low power dissipation and high fault coverage patterns for scan-based BIST," Proc. ITC, pp. 834-843, 2002.

S. Wang and S.K. Gupta, "DS-LFSR: A BIST TPG for low switching activity," IEEE Trans. CAD, vol. 21, pp. 842-851, Jul. 2002.

S. Wang and S.K. Gupta, "LT-RTPG: A new test-per-scan BIST TPG for low switching activity," IEEE Trans. CAD, vol. 25, pp. 1565-1574, Aug. 2006.

X. Zhang and K. Roy, "Power reduction in test-per-scan BIST," Proc. OLTW, pp. 133-138, 2000.

C. Zoellin, H.-J. Wunderlich, N. Maeding, and J. Leenstra, "BIST power reduction using scan-chain disable in the Cell processor," Proc. ITC, 2006, paper 32.3.

* cited by examiner

TEST GENERATOR FOR LOW POWER BUILT-IN SELF-TEST

RELATED APPLICATIONS

This application claims priority to both U.S. Provisional Patent Application No. 61/477,105, entitled "Low-Power Pseudo-Random Test Pattern Generator," filed on Apr. 19, 2011, and naming Grzegorz Mrugalski et al. as inventors, and U.S. Provisional Patent Application No. 61/543,229, entitled "Test Generator with Preselected Toggling for Low Power Built-In Self-Test," filed on Oct. 4, 2011, and naming Janusz Raj ski et al. as inventors, both of which application are incorporated entirely herein by reference.

FIELD OF THE INVENTION

The present invention is directed to integrated circuit testing technology. Various aspects of the invention may be particularly useful for low power BIST (Built-In Self-Test)-based testing.

BACKGROUND OF THE INVENTION

Various forms of embedded test are increasingly viewed as essential to reduce test cost. Among them, scan testing has gained broad acceptance as a reliable solution. Because of the high data activity associated with scan-based test operations, however, a circuit under test can dissipate much more power than it was designed to function under. A full-toggle scan pattern, for example, may draw several times the typical functional mode power. The excess power consumed during a test may result in thermal issues, voltage noise, or power droop, which, in turn, cause a yield loss, severe decrease in chip reliability, shorter product lifetime, or device malfunction. Abnormal switching activity may also cause fully functional chips to fail during testing because of phenomena such as IR-drop, crosstalk, or di/dt problem. Thus, reductions in the operating power of ICs in a test mode have been of concern for years.

Numerous schemes for power reduction during scan testing have been proposed. Among them, there are solutions specifically for built-in self-test (BIST). For example, the test power can be reduced by preventing transitions at memory elements from propagating to combinational logic during scan shift operations. This is achieved by inserting gating logic between scan cell outputs and logic circuits they drive. During normal operations and capture, this logic remains transparent. In another scheme, on-chip clock gating circuitry is used to selectively block scan chains while employing test scheduling and planning to further decrease BIST power in the Cell processor. In still another scheme, some test patterns generated by a linear feedback shift register (LFSR) are masked as not all produced vectors detect faults.

The advent of low-transition test pattern generators has added a new dimension to power aware BIST solutions. In a device comprised of an LFSR feeding scan chains through biasing logic and T-type flip-flop, the T-type flip-flop holds the previous value until its input is asserted and thus, the same value is repeatedly scanned into scan chains until the value at the output of biasing logic (e.g., a k-input AND gate) becomes 1. Depending on k, one can significantly reduce the number of transitions occurring at the scan chain inputs. In a dual-speed LFSR consists of two LFSRs driven by normal and slow clocks, respectively, the switching activity is reduced at the circuit inputs connected to the slow-speed LFSR, while the whole scheme is still ensuring satisfactory fault coverage.

Mask patterns are used in to mitigate the switching activity in LFSR-produced patterns, whereas a bit swapping achieves the same goal at the primary inputs of CUT. A gated LFSR clock may allow one to activate only half of LFSR stages at a time, thus reducing power consumption as only half of the circuit inputs change every cycle. A scheme that combines the low transition generator of (handling easy-to-detect faults) with a 3-weight PRPG (deployed to detect random pattern resistant faults) can also be used to reduce switching activity during BIST-based testing. There are also schemes suppressing transitions in LFSR-generated sequences by either statistical monitoring or injecting intermediate and highly correlated patterns. Finally, a random single-input change generator can produce low power patterns in a parallel BIST environment.

BRIEF SUMMARY OF THE INVENTION

Aspects of the invention relate to low power BIST-based testing. With various implementations of the invention, a low power test generator may comprise a pseudo-random pattern generator unit, a toggle control unit configured to generate toggle control data based on bit sequence data generated by the pseudo-random pattern generator unit, and a hold register unit configured to generate low power test pattern data by replacing, based on the toggle control data received from the toggle control unit, data from some or all of outputs of the pseudo-random pattern generator unit with constant values during various time periods. The low power test generator may further comprise a phase shifter configured to combine bits of the low power test pattern data for driving scan chains.

The pseudo-random pattern generator unit may comprise a pseudo-random pattern generator. The pseudo-random pattern generator may be a linear feedback shift registers (LFSR), a linear cellular automaton, or a ring generator. The pseudo-random pattern generator unit may further comprise a phase shifter.

The toggle control unit may comprise a toggle control data generation subunit configured to generate the toggle control data by combining the bit sequence data and a toggle control data register subunit configured to receive, store and output the toggle control data. The toggle control data register subunit may comprise a shift register. The toggle control data register subunit may further comprise a control data register or a shadow register. The toggle control data generation subunit may comprise a generation module configured to generate one or more sets of initial toggle control data by combining the bit sequence data generated by the pseudo-random pattern generator unit, and a selection/combination module configured to produce the toggle control data based on the one or more sets of initial toggle control data.

In some embodiments of the invention, the toggle control unit may comprise a toggle control data generation subunit configured to generate preliminary toggle control data by combining the bit sequence data, a toggle control data register subunit configured to receive, store and output the preliminary toggle control data, and a toggle mode control subunit configured to generate the toggle control data by replacing the preliminary toggle control data with toggle mode control data during some time periods.

The hold register unit may comprise a register having a plurality of independent register segments or a plurality of registers such as flip-flops or latches.

With various implementations of the invention, a method of low power built-in self-test may comprise: generating bit sequence data with a pseudo-random pattern generator unit, generating toggle control data based on the bit sequence data, and generating low power test pattern data by replacing, based on the toggle control data, data from some or all of outputs of the pseudo-random pattern generator with constant values during various time periods. The method of low power built-in self-test may further comprise combining bits of the low power test pattern data with a phase shifter.

BRIEF DESCRIPTION OF THE DRAWINGS

FIG. 4 illustrates an example of a low power test generator constructed according to the basic structure shown in FIG. 1a.

DETAILED DESCRIPTION OF THE INVENTION

Various aspects of the present invention relate to low power BIST-based testing techniques. In the following description, numerous details are set forth for the purpose of explanation. However, one of ordinary skill in the art will realize that the invention may be practiced without the use of these specific details. In other instances, well-known features have not been described in detail to avoid obscuring the present invention.

Some of the techniques described herein can be implemented by a computer-readable medium having software instructions stored thereon, a programmable computer system executing software instructions, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms such as "apply," "capture," "load," and "unload" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one integrated circuit device, such as data to be used to form multiple integrated circuit devices on a single wafer.

Basic Architecture of Low Power Test Generators

Figure 1A:
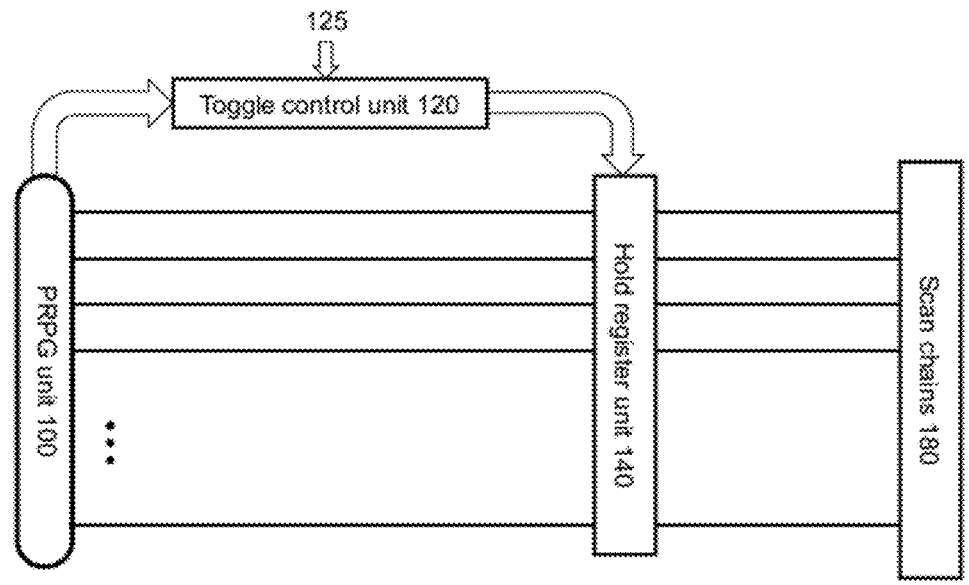
FIG. 1a illustrates an example of a basic structure of a low power test generator according to various implementations of the invention.

FIG. 1a illustrates an example of a basic structure of a low power test generator according to various implementations of the invention. The low power test generator includes a PRPG unit 100, a toggle control unit 120, and a hold register unit 140. The PRPG unit 100 may be implemented with a pseudo-random test pattern generator (PRPG). A linear feedback shift registers (LFSR), a linear cellular automaton, and a ring generator are three conventional PRPGs, each of which may be used in the PRPG unit 100. In addition to a PRPG, the PRPG unit 100 may also comprise a phase shifter. The phase shifter can rectify the correlation and/or linear dependency problems associated with bit sequence data generated by the PRPG by combining various bits in the bit sequence data.

The toggle control unit 120 is configured to generate toggle control data based on the bit sequence data generated by the PRPG unit 100. The toggle control unit 120 may use the bit sequence data generated by a PRPG in the PRPG unit 100 directly or use the output data from a phase shifter in the PRPG unit 100. Additionally, the toggle control data may be derived based on predefined or user-supplied data 125. Various structures of the toggle control unit 120 and methods for generating the toggle control data will be discussed in detail in the next section.

The hold register unit 140 is configured to generate low power test pattern data. The hold register unit 140 may comprise a register having one or more independent register segments. The number of the independent register segments may be equal to the number of outputs of the PRPG unit 100, thereby each of the outputs being coupled an independent register segment. Each of the independent register segments can be implemented with, for example, a flip-flop or a latch. During various time periods depending on the toggle control data, some or all of the independent register segments may be transparent to data from corresponding outputs of the PRPG unit 100, while the rest of the independent register segments may replace data from corresponding outputs of the PRPG unit 100 with constant values. The constant values may be captured at a certain clock cycle, also depending on the toggle control data. The outputs of the hold register unit 140 drive scan chains 180 as shown in FIG. 1a.

Figure 1B:
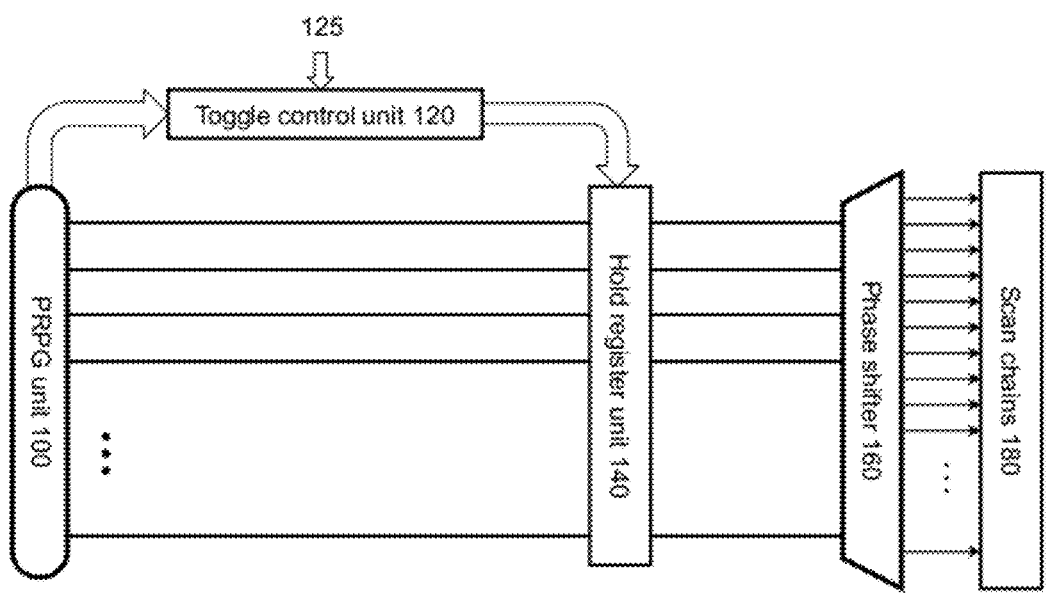
FIG. 1b illustrates another example of a basic structure of a low power test generator according to various implementations of the invention.

FIG. 1b illustrates another example of a basic structure of a low power test generator according to various implementations of the invention. Compared to the example shown in FIG. 1a, the low power test generator in FIG. 1b inserts a phase shifter 160 between the hold register unit 140 and the scan chains 180. The PRPG unit 100 may or may not have a phase shifter.

Illustrative Examples of Low Power Test Generators

Figure 2:
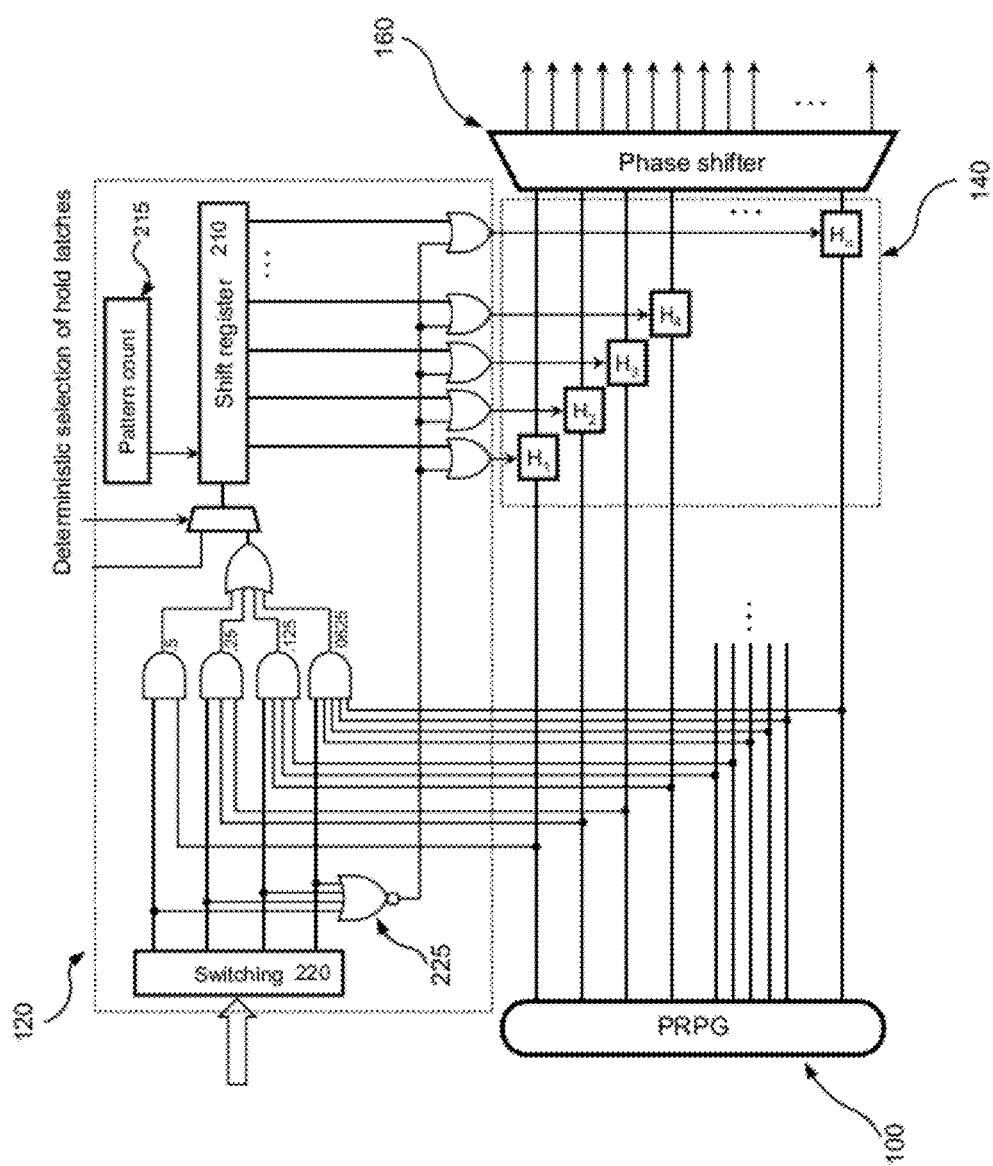
FIG. 2 illustrates an example of a low power test generator constructed according to the basic structure shown in FIG. 1b.

FIG. 2 illustrates an example of a low power test generator constructed according to the basic structure shown in FIG. 1b. The PRPG unit 100 comprises an n-bit conventional PRPG. The hold register unit 140, comprising n hold latches, is placed between the PRPG unit 100 and the phase shifter 160. Each hold latch in the hold register unit 140 is individually controlled by a corresponding stage of an n-bit shift register 210 in the toggle control unit 120. When the enable input of a hold latch is asserted (e.g., by a logical value "1"), this hold latch is transparent to data going from the PRPG unit 100 to the phase shifter 160. This enabled latch is said to be in a toggle mode. When a hold latch is disabled, e.g., by a logical value "0" at its enable input, this hold latch captures and saves the corresponding bit of the PRPG unit 100 for a number of clock cycles, thereby feeding the phase shifter 160 with a constant value. This disabled hold latch is said to be in a hold mode. Each output of the phase shifter 160 may be obtained by XOR-ing outputs of, for example, three different hold latches. Accordingly, a scan chain may remain in a low-power mode (being loading with constant values) provided the corresponding phase shifter output is driven by disabled hold latches.

The n-bit shift register 210 forms a main part of a toggle control data register subunit in the toggle control unit 120. A pattern count module 215 may be added to the toggle control data register subunit and be configured to update the toggle control data stored in the n-bit shift register 210 for each test pattern.

Besides the toggle control data register subunit for storing and applying the toggle control data, the toggle control unit 120 also comprises a toggle control data generation subunit configured to generate the toggle control data in a probabilistic fashion. The toggle control data generation subunit comprises two modules, a generation module and a selection/combination module. The generation module comprises four AND gates that combine various numbers of bits of the bit sequence data generated by the PRPG unit 100 to generate four sets of initial toggle control data. These four sets of initial toggle control data have logical ones with probabilities of 0.5, 0.25, 0.125 and 0.0625, respectively.

The OR gate in FIG. 2 along with a 4-bit register 220 forms a main part of the selection/combination module, and allows a logical "1" being produced with one of the above four probabilities or beyond simple powers of 2. For example, if a switching code 0100 is stored in the register 220, then, on the average, 25% of the stages of the shift register 210 will be set to 1, and thus 25% of hold latches will be enabled. Based on the architecture of the phase shifter 160, one can assess the amount of scan chains receiving constant values, and thus the expected toggling ratio.

When the switching code is 0000, a 4-input NOR gate 225 switches the low power mode off through the OR gates. The multiplexer placed in the front of the serial input of the shift register 210 allows predetermined toggle control data to be applied. As such, the low power test generator will be working in a deterministic manner: which hold latches are in the hold mode at a certain time period may be known.

It should be noted that when the toggle control data generated based on outputs from the four AND gates are selected, the shift register 210 contains statistically stable content in terms of the amount of logical ones it carries. As a result, a corresponding fraction of scan chains may stay in the low power mode, though a set of actual low toggling chains will keep changing from one test pattern to another.

Figure 3:
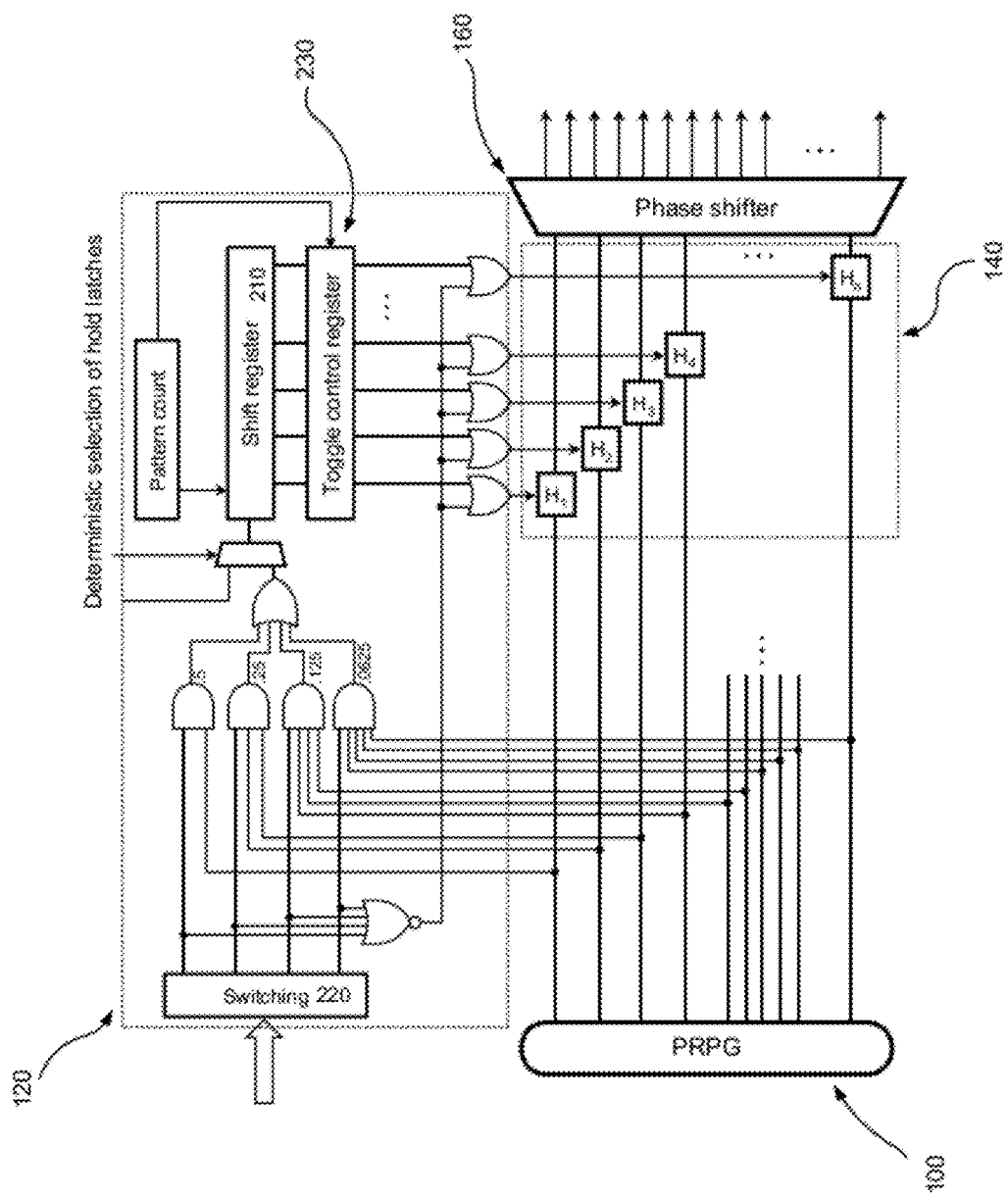
FIG. 3 illustrates an example of a low power test generator similar to the one in FIG. 2 but with a shadow register.

FIG. 3 illustrates a variant of the low power test generator shown in FIG. 2. In this low power test generator, the toggle control data register subunit further comprises a toggle control register 230. The toggle control register 230 serves as a shadow register and may update its content for every new test pattern. The use of a shadow register may not only reduce correlation between the toggle control data for successive test patterns, but also simplify distributed fault simulation as the toggle control data can be easily computed based on the state of the PRPG for the previous vector.

Figure 4:
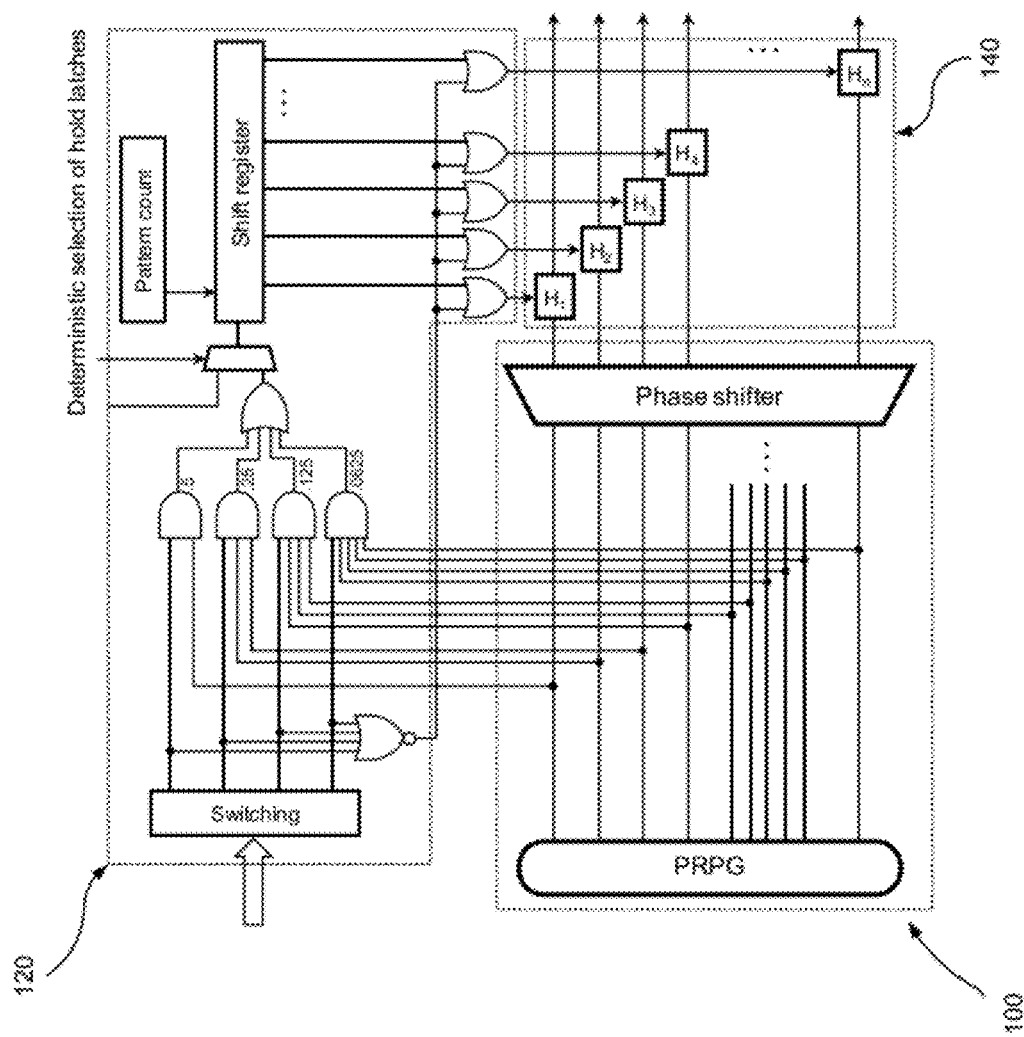

FIG. 4 illustrates an example of a low power test generator constructed according to the basic structure shown in FIG. 1a. Unlike the low power test generator shown in FIG. 2, the PRPG unit 100 comprises an n-bit conventional PRPG and a phase shifter. From another point of view, the main difference between the low power test generators shown in FIGS. 2 and 4 is: the hold latches in FIG. 4 are placed after the phase shifter and in front of scan chains while the hold latches in FIG. 2 are placed between the PRPG and the phase shifter. Accordingly, the low power test generator in FIG. 4 needs more hold latches (one hold latch per scan chain) and a longer shift register. This circuit configuration may allow reducing switching activity either in adjacent groups of scan chains or in any predetermined groups of scan chains.

Figure 5:
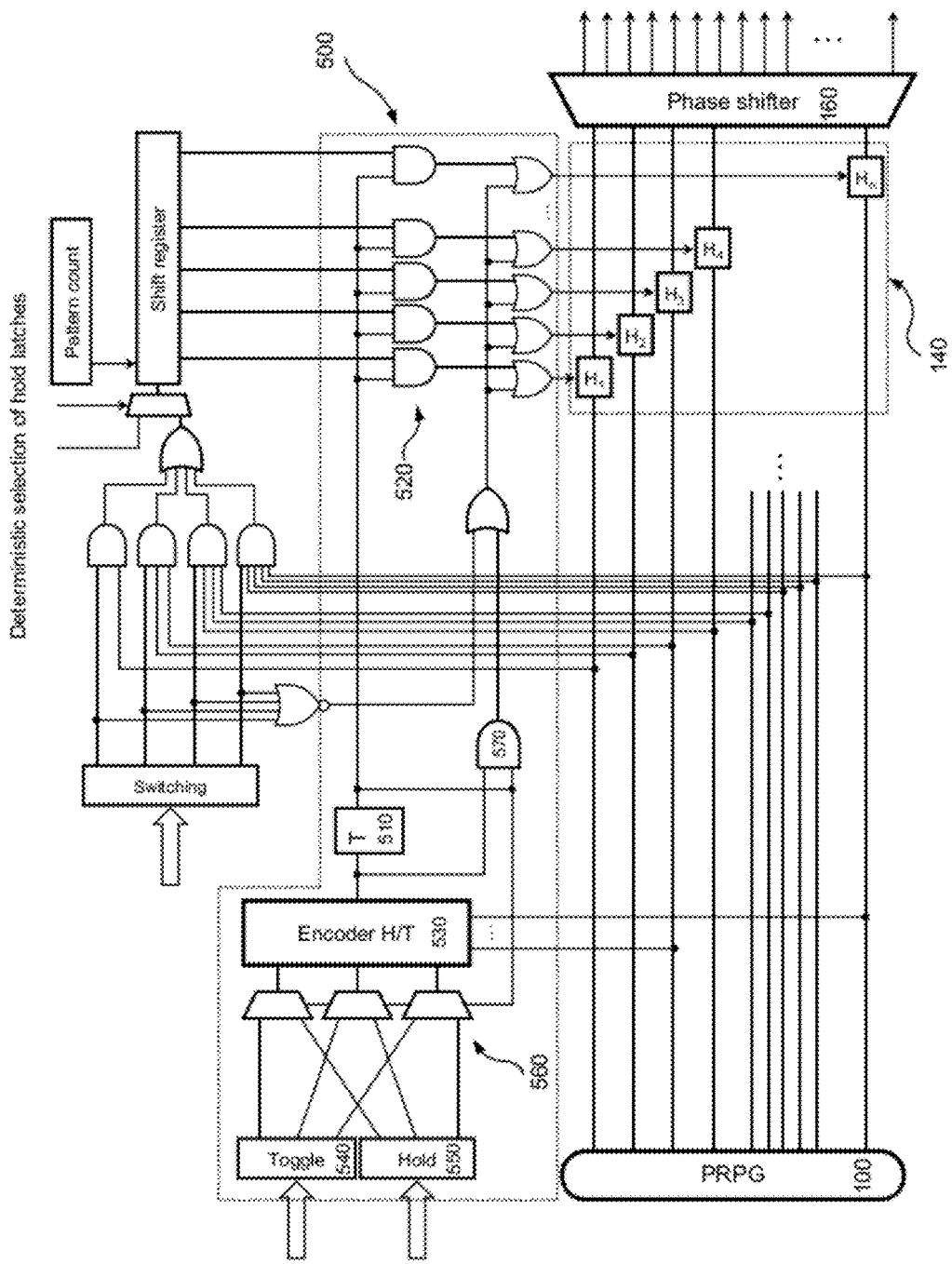
FIG. 5 illustrates an example of a low power test generator having a toggle mode control subunit 500 inside its toggle control unit.

The low power test generators illustrated in FIGS. 2-4 can have 15 different switching codes for selecting/combining outputs from the four AND gates. The varieties of the obtained toggle control data are limited. Much higher flexibility in forming low-toggling test patterns may be achieved by a toggle mode control subunit 500 into the toggle control unit 120, as illustrated in FIG. 5. While preserving the operational principles of the low power test generators illustrated in FIGS. 2-4, this approach can divide a shifting period of every test pattern into a sequence of alternating hold and toggle periods. To move the generator back and forth between these two states, a T-type flip-flop 510 is employed. This T-type flip-flop 510 switches whenever there is a 1 on its data input. If it is set to 0, then the low power test generator enters a hold period with all latches temporarily disabled regardless of the shift register content. The disabling is implemented by placing AND gates 520 on the shift register outputs. If the T flip-flop 510 is set to 1 (the toggle period), then the latches enabled through the shift register can pass test data moving from the PRPG to scan chains.

Figure 6:
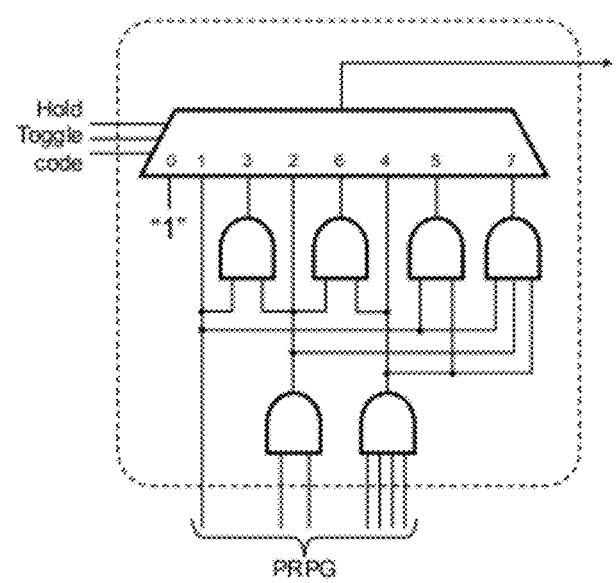
FIG. 6 illustrates an example of using the module Encoder H/T 530 in FIG. 5 to generate a weighted pseudorandom signal for driving the input of the T flip-flop 510 based on the content of seven different stages of the original PRPG 100.

The 3-bit Hold and Toggle registers 550 and 540 in the toggle mode control subunit 500 store data determining how long a hold period or a toggle period is. In order to terminate either period, logic 1 must occur on the input of the T flip-flop 510. FIG. 6 illustrates an example of using the module Encoder H/T 530 to generate a weighted pseudorandom signal for driving the input of the T flip-flop 510 based on the content of seven different stages of the original PRPG 100. Depending on the control code provided by either the Toggle register 540 or the Hold register 550, the output of the encoder 530 can be asserted with a probability ranging from $2^{-1}$ to $2^{-7}$.

Between the 3-bit Hold and Toggle registers 550 and 540 and the T flip-flop 530 lies three 2-input multiplexers 560. These multiplexers 560 route data from the Toggle and Hold registers, effectively allowing a source of control data, toggle vs. hold, to be used in the next cycle. For example, when in the toggle mode (the selected latches remain transparent as long as the T flip-flop is asserted), the input multiplexers are observing the Toggle register 540. Once the encoder outputs 1, the flip-flop toggles, and as a result, all hold latches freeze in the last recorded state. They will remain in this state until another 1 occurs on the encoder output. The random occurrence of this event is related to the content of the Hold register, which determines when to terminate the hold period.

The low power test generator in FIG. 5 also allows periodical reloading of hold latches that remain disabled due to the corresponding 0s occurring in the shift register. This property may enrich the content of low-power scan chains with a negligible impact on the total transition count. When output of an AND gate 570 is asserted, all hold latches are enabled and can be reloaded. This AND gate 570 assumes the value of 1 just before the generator goes into a hold period. During a toggle period, one input of the AND gate 570 remains at 1. At the moment of a transition to a hold period, the other input of the AND gate 570 changes to 1. The AND gate 570 will output a 1 before changing to 0 shortly afterward.

Figure 7:
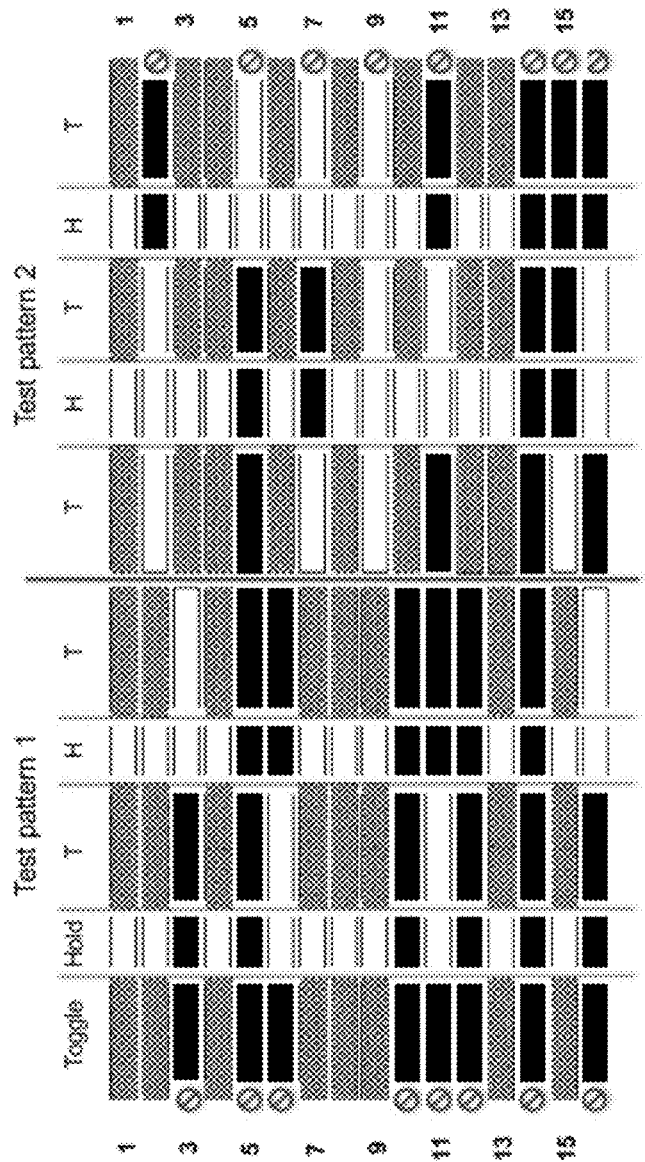
FIG. 7 illustrates an example of a switching profile of 16 scan chains produced by the low power test generator in FIG. 5.

An example of a switching profile of 16 scan chains produced by the low power test generator in FIG. 5 is illustrated in FIG. 7. The switching profile is for two test patterns. White and black solid bars indicate constant 0s and 1s, respectively, while the rest correspond to periods of toggling. Scan chains 3, 5-6, 10-12, 14 and 16 are fed with constant values during the loading of test pattern 1. During the loading of test pattern 2, scan chains 2, 5, 7, 9, 11 and 14-15 are fed with constant values. Although they are different, their quantity does not change between patterns. As can be seen, test patterns may be divided into hold and toggle periods of random lengths, and low power scan chains may receive different values in different periods due to the reloading of all latches at the beginning of the hold periods.

Figure 8:
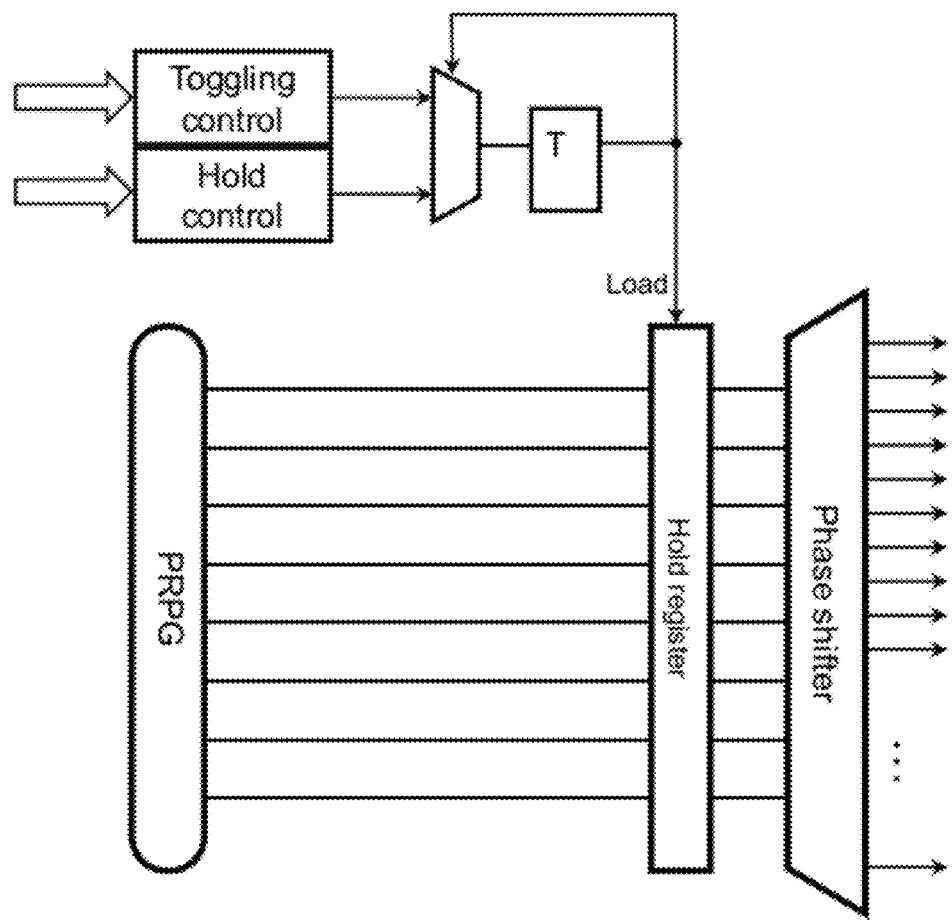
FIG. 8 illustrates an example of a low power test generator in which the toggle control unit is implemented mainly with a toggle mode control unit.

As noted earlier, the difference between the two low power test generators illustrated in FIG. 2 and FIG. 5, respectively, is the addition of the toggle mode control subunit 500 to the toggle control unit 120 in the latter. With some implementations of the invention, the toggle control unit 120 may be implemented by the toggle mode control subunit 500, as illustrated in FIG. 8. The hold register is reloaded anytime the T-type flip-flop is set to 1. The same T-type flip-flop switches whenever there is a logical 1 on its data input. Furthermore, the T flip-flop controls a multiplexer on its input. It effectively allows to select a source of data that will be used in the next cycle to possibly change the operational mode of the generator. For example, when in the toggling mode (the hold register is reloaded every clock cycle as long as the T flip-flop is asserted), the input multiplexer is actually observing the control unit corresponding to the hold mode. Once this block outputs 1, the flip-flop toggles, and as a result, the hold register freezes in the last recorded state. In addition, the multiplexer allows now the toggling control unit to be connected to the flip-flop. Consequently, the generator will remain in the low-power mode until the first 1 produced by the toggling control. A user may access both control modules in order to provide them with data necessary to arrive with desired values of hold and toggling time periods.

Figure 9:
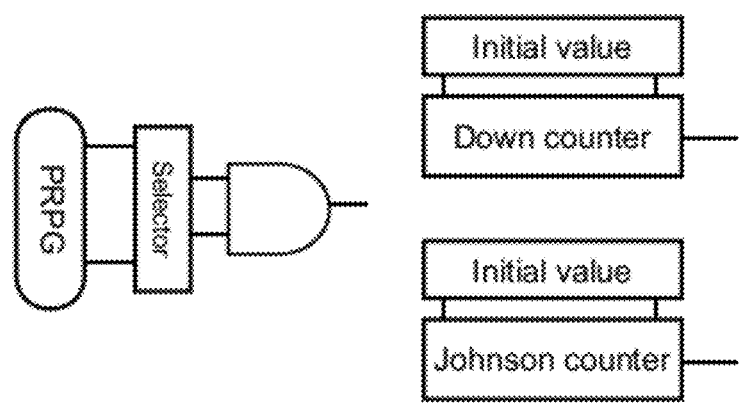
FIG. 9 illustrates three examples of how the toggling/hold control blocks in FIG. 8 can be implemented.

FIG. 9 illustrates three examples of how the toggling/hold control blocks in FIG. 8 can be implemented. If the enable signal is to be produced in a probabilistic fashion, one can use a weighted pseudo-random pattern generator with a programmable set of weights. A PRPG feeding a simple AND gate is shown in the figure. A selector is employed here to choose the number of active gate inputs, and thus to generate different output signals. The deterministic solutions may use different forms of counting, either by employing a conventional binary down counter, a ring counter, or a Johnson counter. In each case, one can select an initial value representing the toggling or hold periods, and then observe an appropriate output of a counter in order to change the mode of operation, accordingly.

Figure 10:
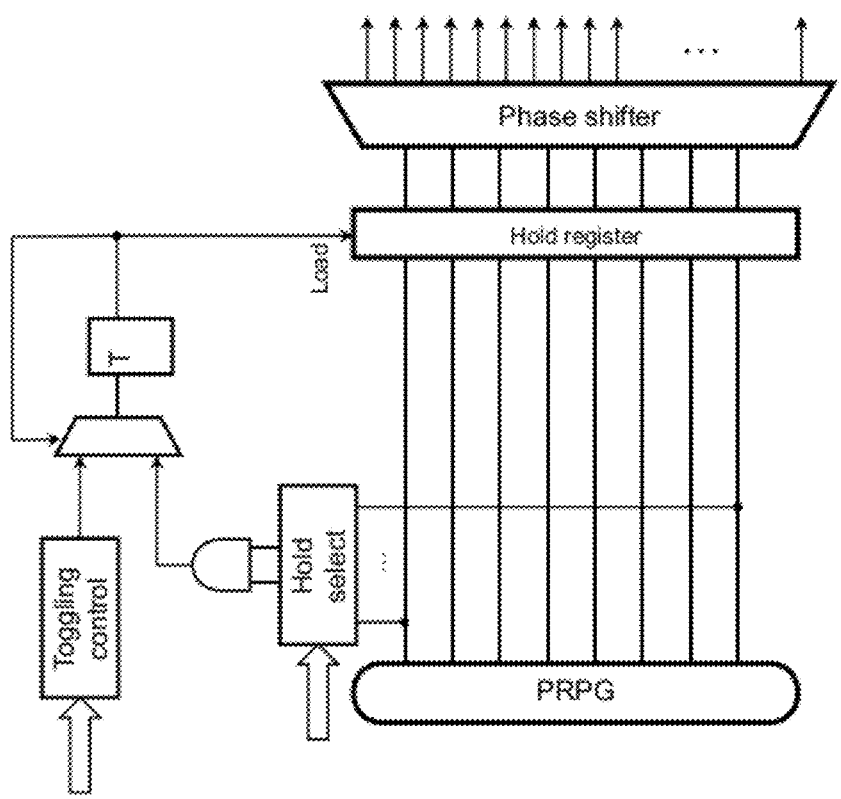
FIG. 10 illustrates an example of a low power test generator with the hold select module coupled to the PRPG.
Figure 11:
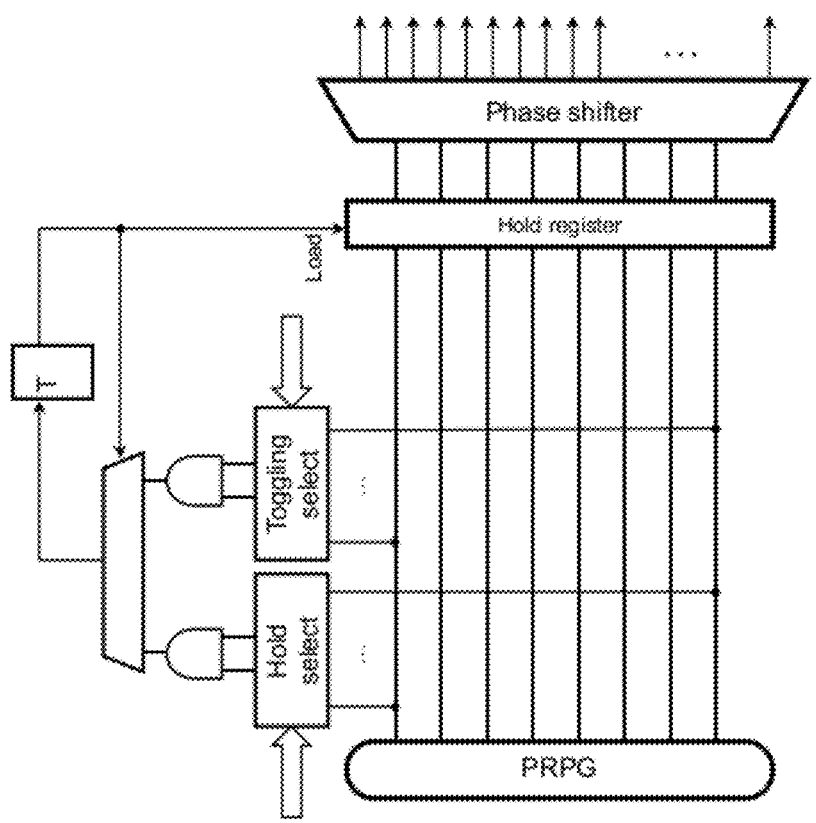
FIG. 11 illustrates an example of a low power test generator with both the toggling select module and the hold select module coupled to the PRPG.

The PRPG in FIG. 9 may be the original PRPG in FIG. 8, similar to the scheme in FIG. 5. FIGS. 10 and 11 illustrate two such examples. In FIG. 10, the original PRPG produces pseudorandom samples for one of the control units (the generator of FIG. 9 is an illustrative embodiment of such a structure). As can be seen, the hold control module is a weighted pseudorandom signal generator. The weights are set through the inputs of the hold select block, while the actual patterns are produced by the original PRPG. Although the hold mode is now selected in a pseudorandom fashion, the toggling state can still be implemented by means of random or deterministic techniques. Clearly, the reversed approach is possible as well: the toggling control can be random, while the hold mode is selected either randomly or deterministically. In FIG. 11, both control blocks, dependent on the original PRPG, are weighted pseudorandom pattern generators with programmable weights provided by a user.

Figure 12:
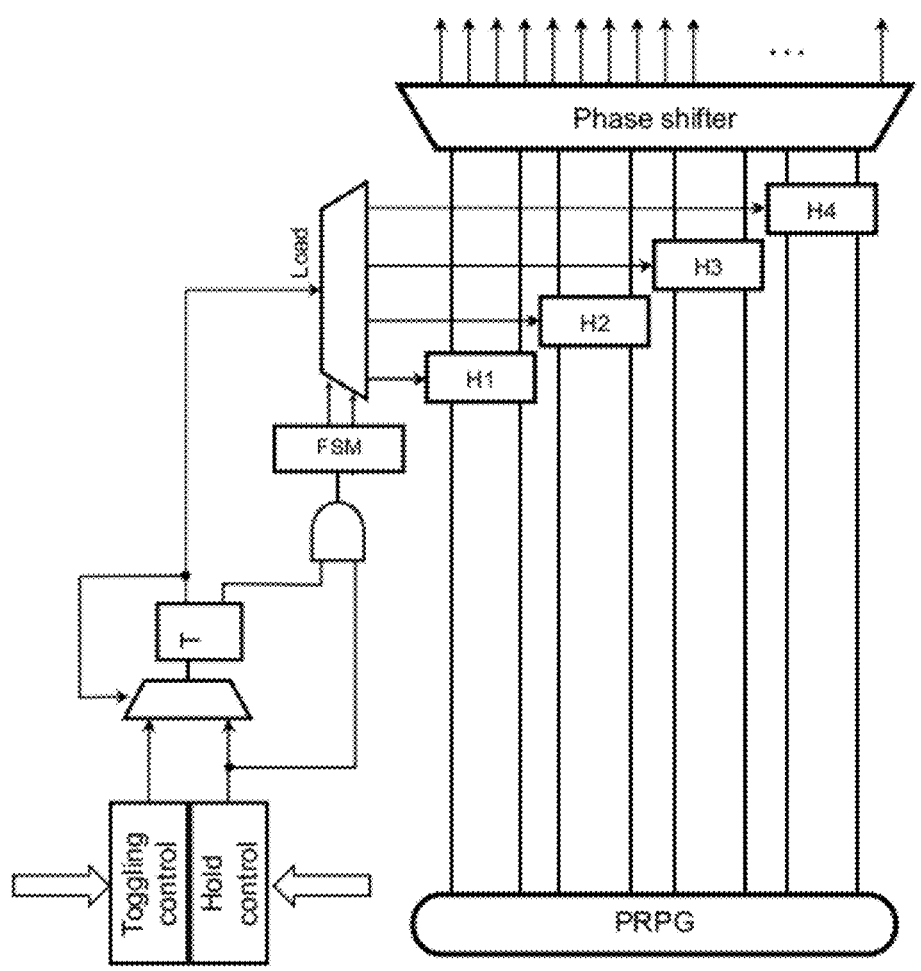
FIG. 12 illustrates an example of a low power test generator having a multi-independent-segment hold register.

As discussed above, the hold register may comprise a number of independent register segments (or registers). Each register segment can be enabled (reloaded) independently of others. FIG. 12 illustrates such an example, in which a decoder driven by the T flip-flop and additional selection logic (represented by another FSM) is employed. In the figure, a demultiplexer serves to connect the load signal provided by the T flip-flop to a single destination hold register. The FSM specifies which hold register segment becomes the subject of enabling or disabling. As a result, one hold register at most remains in the toggling mode at a time, while the others provide constant values to the phase shifter. A binary counter or an LFSR may act here as the demux address generator, hence enabling the hold registers in a circular or any other suitable order. The FSM is pulsed every time the output of additional AND gate is asserted. As can be easily observed, this particular gate is assuming the value of 1 whenever the generator remains in the hold mode (all hold registers are still) and there is a signal from the hold control that indicates the end of this phase. The FSM is then selecting another hold register to enter the toggling mode.

Figure 13:
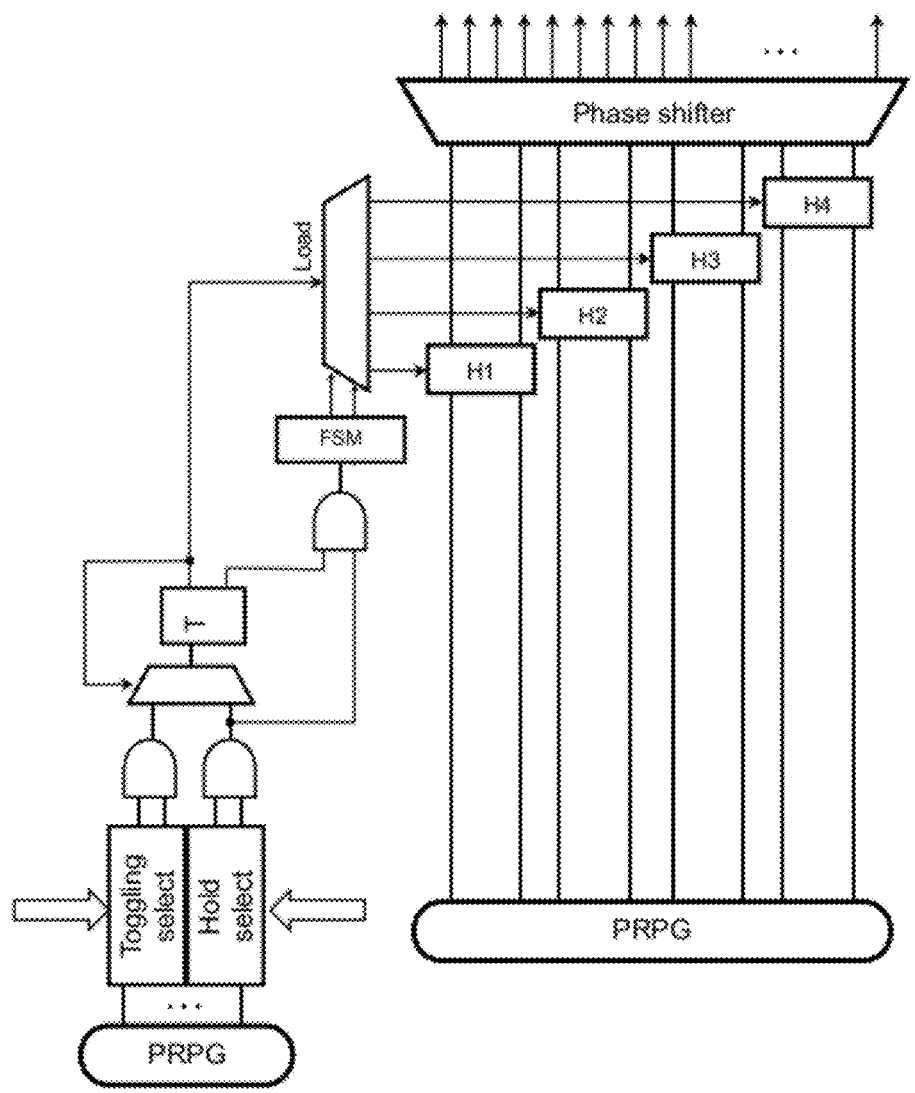
FIG. 13 illustrates an example of a low power test generator having a multi-independent-segment hold register and an additional PRPG for the toggle control unit.
Figure 14:
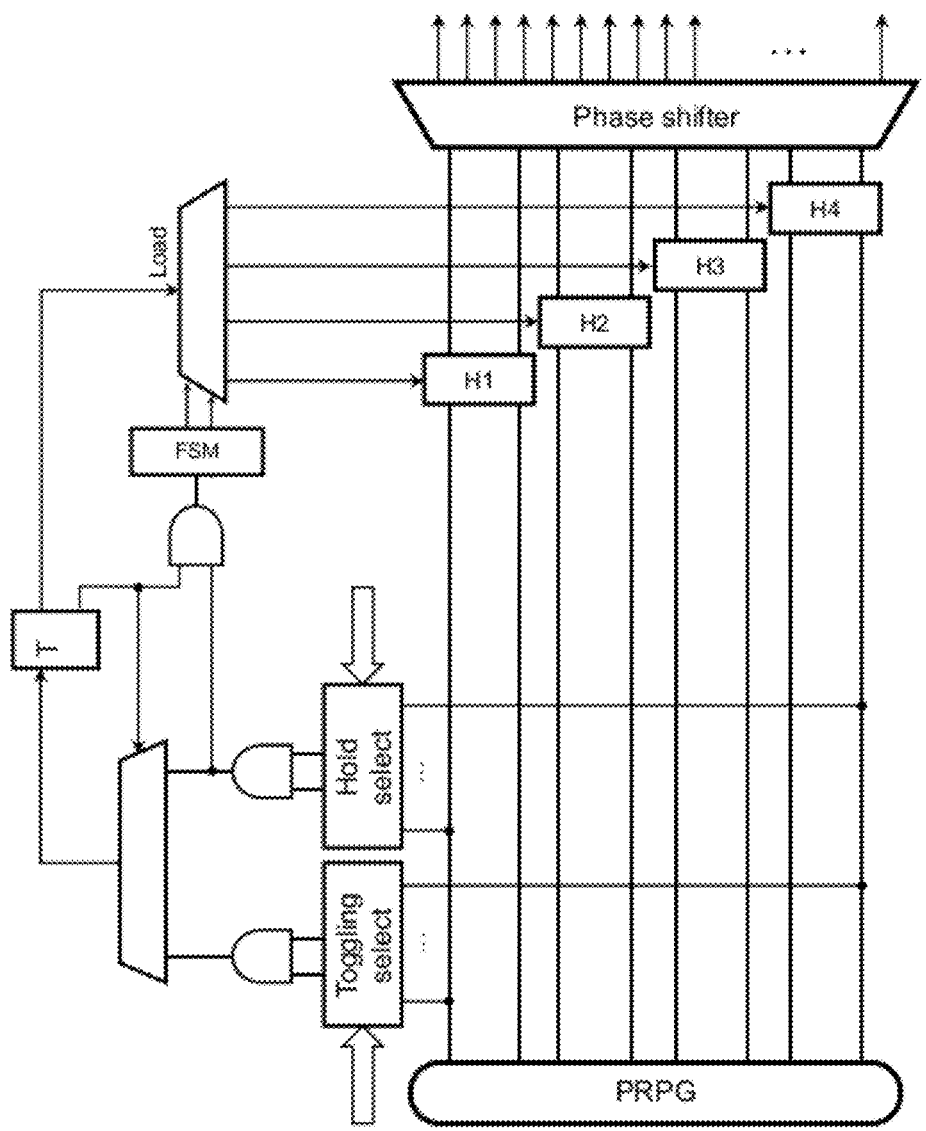
FIG. 14 illustrates an example of a low power test generator similar to the one in FIG. 11 but having a multi-independent-segment hold register.
Figure 15:
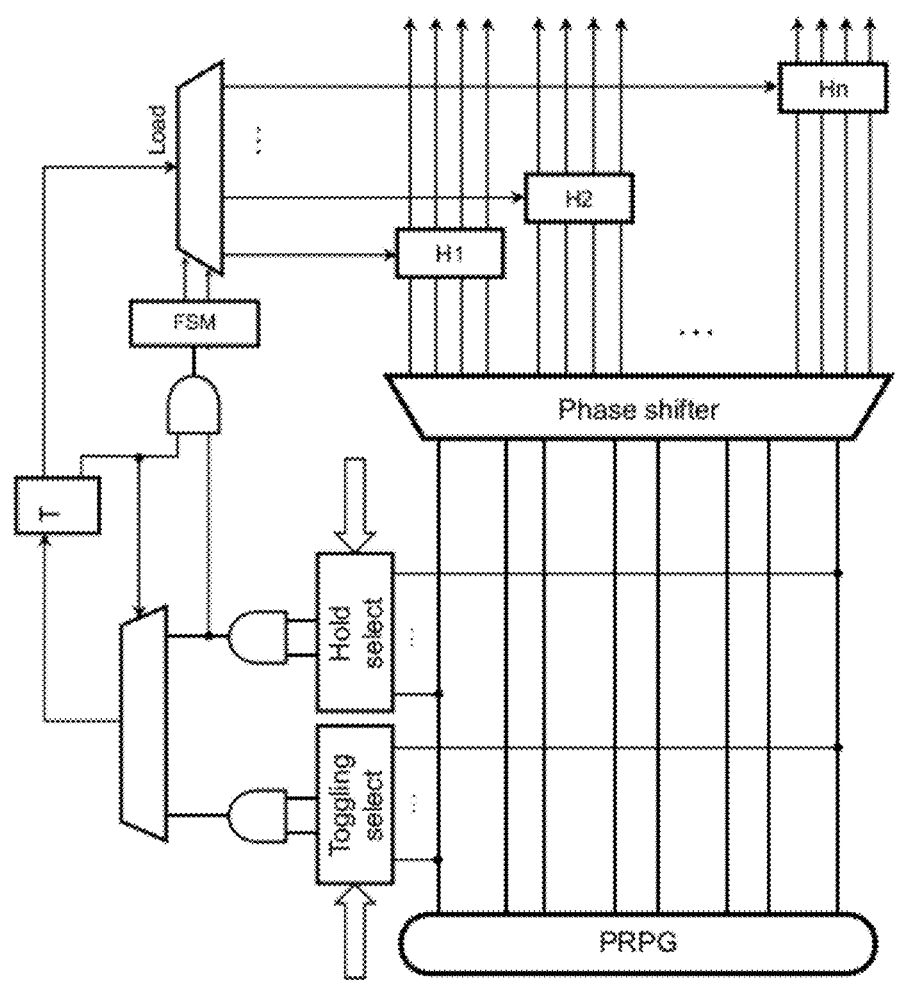
FIG. 15 illustrates an example of an example of a low power test generator with a multi-independent-segment hold register being placed after a phase shifter.

FIGS. 13 and 14 illustrate low power test generators with the segmented hold register, where the toggle control units are implemented in a manner similar to that of FIGS. 8 and 11, respectively. The hold register may also be placed in the front of scan chains, as illustrated in FIG. 15. This configuration may need as many flip-flops as the number of scan chains in addition to more complex decoder and the associated FSM.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A test generator for low power built-in self-test, comprising:
   a pseudo-random pattern generator unit;
   a toggle control unit configured to generate toggle control data based on bit sequence data generated by the pseudo-random pattern generator unit; and
   a hold register unit configured to generate low power test pattern data by replacing, based on the toggle control data received from the toggle control unit, data from some or all of outputs of the pseudo-random pattern generator unit with constant values during various time periods.

2. The test generator recited in claim 1, further comprising:
a phase shifter configured to combine bits of the low power test pattern data for driving scan chains.

3. The test generator recited in claim 1, wherein the pseudo-random pattern generator unit comprises a pseudo-random pattern generator.

4. The test generator recited in claim 3, wherein the pseudo-random pattern generator is a ring generator.

5. The test generator recited in claim 3, wherein the pseudo-random pattern generator is a linear feedback shift register.

6. The method recited in claim 1, wherein the pseudo-random pattern generator unit comprises:
a pseudo-random pattern generator configured to generate the bit sequence data; and
a phase shifter configured to combine the bit sequence data.

7. The test generator recited in claim 1, wherein the toggle control unit comprises:
a toggle control data generation subunit configured to generate the toggle control data by combining the bit sequence data; and
a toggle control data register subunit configured to receive, store and output the toggle control data.

8. The test generator recited in claim 7, wherein the toggle control data register subunit comprises:
a shift register.

9. The test generator recited in claim 7, wherein the toggle control data register subunit comprises:
a shift register; and
a control data register coupled to parallel outputs of the shift register.

10. The test generator recited in claim 7, wherein the toggle control data register subunit is configured to update the stored toggle control data for each test pattern.

11. The test generator recited in claim 7, wherein the toggle control data generation subunit comprises:
a generation module configured to generate one or more sets of initial toggle control data by combining the bit sequence data; and
a selection/combination module configured to produce the toggle control data based on the one or more sets of initial toggle control data.

12. The test generator recited in claim 1, wherein the toggle control unit comprises:
a toggle control data generation subunit configured to generate preliminary toggle control data by combining the bit sequence data;
a toggle control data register subunit configured to receive, store and output the preliminary toggle control data; and
a toggle mode control subunit configured to generate the toggle control data by replacing the preliminary toggle control data with toggle mode control data during some time periods.

13. The test generator recited in claim 1, wherein the generation of the toggle control data by the toggle control unit is further based on user-set data.

14. The test generator recited in claim 1, wherein the hold register unit comprises a register having a plurality of independent register segments.

15. The test generator recited in claim 14, wherein the number of the plurality of independent register segments is equal to the number of the outputs of the pseudo-random pattern generator unit.

16. A method of low power built-in self-test, comprising:
generating bit sequence data with a pseudo-random pattern generator unit;
generating toggle control data based on the bit sequence data; and
generating low power test pattern data by replacing, based on the toggle control data, data from some or all of outputs of the pseudo-random pattern generator with constant values during various time periods.

17. The method recited in claim 16, further comprising:
combining bits of the low power test pattern data with a phase shifter.

18. The method recited in claim 16, wherein the generating low power test pattern data is performed by a hold register unit.

19. The method recited in claim 18, wherein the hold register unit comprises a register having a plurality of independent register segments.

20. The method recited in claim 19, wherein, based on the toggle control data, the plurality of independent register segments can work in two modes, a toggling mode and a holding mode.

* * * * *